United States Patent
He et al.

(10) Patent No.: US 11,874,336 B2
(45) Date of Patent: *Jan. 16, 2024

(54) METHOD AND SYSTEM FOR DIAGNOSING OPEN-CIRCUIT FAULT OF POWER SWITCHING DEVICE OF THREE-PHASE THREE-LEVEL RECTIFIER

(71) Applicant: WUHAN UNIVERSITY, Hubei (CN)

(72) Inventors: Yigang He, Hubei (CN); Mingyun Chen, Hubei (CN); Chunsong Sui, Hubei (CN); Zhaorong Zeng, Hubei (CN); Hui Zhang, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 22 days.

This patent is subject to a terminal disclaimer.

(21) Appl. No.: 17/494,847

(22) Filed: Oct. 6, 2021

(65) Prior Publication Data
US 2022/0146592 A1 May 12, 2022

(30) Foreign Application Priority Data
Nov. 10, 2020 (CN) .......................... 202011245559.2

(51) Int. Cl.
*G01R 31/40* (2020.01)
*G01R 19/165* (2006.01)
*G01R 31/327* (2006.01)

(52) U.S. Cl.
CPC ....... *G01R 31/40* (2013.01); *G01R 19/16557* (2013.01); *G01R 31/327* (2013.01)

(58) Field of Classification Search
CPC ............. G01R 31/40; G01R 19/16557; G01R 31/327; G01R 31/54
See application file for complete search history.

(56) References Cited

U.S. PATENT DOCUMENTS

2019/0173384 A1* 6/2019 Kutsuki ............... G01R 31/327

FOREIGN PATENT DOCUMENTS

| CN | 105158623 A | * | 12/2015 | |
| CN | 111624514 A | * | 9/2020 | ......... G01R 31/2601 |
| WO | WO-2017083527 A1 | * | 5/2017 | ............. G01R 31/40 |

\* cited by examiner

*Primary Examiner* — Son T Le
(74) *Attorney, Agent, or Firm* — JCIPRNET

(57) ABSTRACT

A method and a system for diagnosing a fault of a three-phase three-level rectifier are relate to the technical field of fault diagnosis of power electronic equipment, and provided to implement identification and location of an open-circuit fault of a power switching device thereof. A deviation between an expected value and an actual value of a phase-to-phase voltage is adopted as a diagnosis variable. The diagnosis variable is calculated by adopting a screening technique, thereby reducing calculation error to ensure accuracy of diagnosis. Only existing voltage current signals in a control system of the rectifier are required to calculate the diagnosis variable, so no additional hardware is required and low-cost fault diagnosis can be implemented. Different voltage thresholds are adopted for different fault characteristic sections, and the voltage thresholds are updated in real time according to a direct current side voltage, which improves diagnosis speed while ensuring higher robustness.

17 Claims, 3 Drawing Sheets

METHOD AND SYSTEM FOR DIAGNOSING OPEN-CIRCUIT FAULT OF POWER SWITCHING DEVICE OF THREE-PHASE THREE-LEVEL RECTIFIER

CROSS-REFERENCE TO RELATED APPLICATION

This application claims the priority benefit of China application serial no. 202011245559.2, filed on Nov. 10, 2020. The entirety of the above-mentioned patent application is hereby incorporated by reference herein and made a part of this specification.

BACKGROUND

Technical Field

The disclosure relates to the technical field of fault diagnosis of power electronic equipment, and more specifically relates to a method and a system for diagnosing an open-circuit fault of a power switching device of a three-phase three-level rectifier.

Description of Related Art

Compared with the traditional two-level converter, the three-level converter is widely applied to high-voltage high-power scenarios due to advantages such as higher efficiency and lower current harmonics. However, since the three-level converter has more power switching devices that work in the high-frequency switching state for a long time, the three-level converter is one of the most failure-prone component in the converter. For the open-circuit fault of the power switching device, fault-tolerant control may enable the converter system to maintain higher performance and continuous operation. The fault diagnosis is a necessary condition to implement fault-tolerant control. Since different fault-tolerant control strategies need to be adopted for different faulty switches, when the power switching device of the converter has an open-circuit fault, accurately and quickly identifying and locating the fault is an important measure to improve the reliability of the converter.

At present, the research on the open-circuit fault diagnosis of the power switching device of the three-level rectifier mainly focuses on the signal-based method, the model-based method, and the artificial intelligence-based method. The signal-based method performs simple calculation and analysis on measurable signals before and after the fault to implement fault location, and may be divided into the current method and the voltage method according to the type of signals. The current method includes the Parker's current vector angle method, the normalized average current method, and the current zero zone method. The principles of the methods are simple, but the diagnosis speed is slower, and the dependence on the load is strong. The diagnosis speed of the voltage method has been improved, but an additional sensor or measuring circuit is usually required to measure the voltage, and the cost of diagnosis is higher. The model-based method establishes a mathematical model to calculate signals and implements fault diagnosis through analyzing residuals between predicted signals and actual signals. Therefore, no additional hardware is required, and the diagnosis speed is faster, but the diagnosis speed and the robustness still need to be improved. The knowledge-based method mainly adopts theories such as the wavelet transform, the neural network, and the support vector machine to perform signal processing and fault classification on voltage and current signals in the circuit to implement the accurate location of the faulty switching device. Such method generally has intensive calculation and slower diagnosis speed.

Therefore, it is of great significance to research on the method for diagnosing the open-circuit fault of the power switching device of the three-phase three-level rectifier to improve the speed, the applicability, the robustness, etc. of the diagnosis method.

SUMMARY

In view of the above defects or improvement requirements of the prior art, the disclosure proposes a method and a system for diagnosing an open-circuit fault of a power switching device of a three-phase three-level rectifier, which can implement quick, low-cost, high-robustness identification and location the open-circuit faults of all power switching devices in the three-level rectifier.

In order to achieve the above objective, according to one aspect of the disclosure, the method for diagnosing the open-circuit fault of the power switching device of the three-phase three-level rectifier is provided, which includes the following steps.

(1) An expected value $V_{XY}^*(k)$ of a phase-to-phase voltage between an X-phase and a Y-phase of a rectifier k at a current time and an actual value $V_{XY}(k)$ of the phase-to-phase voltage are selected. A deviation $\Delta V_{XY}(k)$ between the two is used as a diagnosis variable, where XY=AB, BC, CA.

(2) Voltage current information required for diagnosis is obtained from a control system of the rectifier. The diagnosis variable $\Delta V_{XY}(k)$ is calculated by adopting a screening technique.

(3) According to fault characteristics of faulty switches at different times, fault sections are classified. A diagnosis threshold $TH_{XY}(k)$ at the current time is updated for a current fault section.

(4) Whether the diagnosis variable exceeds a threshold range and a polarity thereof are judged according to the diagnosis variable $\Delta V_{XY}(k)$ and the diagnosis threshold $TH_{XY}(k)$.

(5) A fault of an internal switching transistor is identified and located according to the above judgment result.

(6) A diagnosis result of the fault is checked to verify whether the diagnosis result is correct, and the diagnosis result of a fault of an external switching transistor that may be misdiagnosed as the fault of the internal switching transistor is corrected to implement identification and location of an external switching fault.

In some alternative embodiments, the expected value $V_{XY}^*(k)$ of the phase-to-phase voltage is obtained from $V_{XY}^*(k)=\frac{1}{2}V_{DC}(k)(S_X(k)-S_Y(k))$, and the actual value $V_{XY}(k)$ of the phase-to-phase voltage is obtained from $$V_{XY}(k) = (E_X(k) - E_Y(k)) - R(I_X(k) - I_Y(k)) - \frac{L}{T}[(I_X(k) - I_X(k-1)) - (I_Y(k) - I_Y(k-1))],$$

where $V_{DC}(k)$ is a direct current side voltage of the rectifier at the current time; $S_X(k)$ and $S_Y(k)$ are respectively switching control signals of the X-phase and the Y-phase of the rectifier, $S_X(k)=1$ represents that switches $S_{X1}$ and $S_{X2}$ are turned on and switches $S_{X3}$ and $S_{X4}$ are turned off, $S_X(k)=0$ represents that the switches $S_{X2}$ and $S_{X3}$ are turned on and the switches $S_{X1}$ and $S_{X4}$ are turned off, and $S_X(k)=1$ represents that the switches $S_{X3}$ and $S_{X4}$ are turned on and the switches $S_{X1}$ and $S_{X2}$ are turned off; $E_X(k)$ and $E_Y(k)$ are respectively alternating current side voltages of the X-phase and the Y-phase of the rectifier; $I_X(k)$ and $I_Y(k)$ are respectively alternating current side currents of the X-phase and the Y-phase of the rectifier; R is an alternating current side equivalent resistance of the rectifier; L is an alternating current side inductance of the rectifier; T is a sampling interval time, k represents a sampling point at the current time, and k−1 represents a sampling point at a previous time.

In some alternative embodiments, Step (2) includes the following.

If there is no switching of three-phase switching control signals between sampling points k and k−1, that is, when $S_A(k)=S_A(k-1)$, $S_B(k)=S_B(k-1)$, and $S_C(k)=S_C(k-1)$ are satisfied, $\Delta V_{XY}(k)=V_{XY}*(k) V_{XY}(k)$; and if one of $S_A(k)=S_A(k-1)$, $S_B(k)=S_B(k-1)$, and $S_C(k)=S_C(k-1)$ is not satisfied, $\Delta V_{XY}(k)$ is not calculated, and $\Delta V_{XY}(k)$ at the current time is regarded as zero.

In some alternative embodiments, Step (3) includes the following.

For the fault diagnosis of the internal switching transistor, the fault sections are divided into a current zero zone and a current non-zero zone. Different thresholds are set for different sections:

$$TH_{XY}(k) = \begin{cases} \dfrac{V_{DC}(k)}{4} - V, & I_{XY}(k) = 0 \\ \dfrac{V_{DC}(k)}{2} - V, & I_{XY}(k) = 1 \end{cases},$$

where V is a preset value, which is a relatively small constant; $I_{XY}(k)=0$ represents that $I_X$ or $I_Y$ is in the current zero zone, $I_{XY}(k)=1$ represents that $I_X$ and $I_Y$ are both in the current non-zero zone, and $V_{DC}(k)$ is a direct current side voltage of the rectifier at the current time.

For the definition of the current zero zone and the current non-zero zone, considering noise and fluctuations of current, the following definition is provided: $I_{XY}(k)=$ $$\begin{cases} 0, & |I_X(k)| \le I_{TH} \text{ or } |I_Y(k)| \le I_{TH} \\ 1, & |I_X(k)| > I_{TH} \text{ and } |I_Y(k)| > I_{TH} \end{cases},$$

where $I_{TH}$ is a current threshold.

In some alternative embodiments, Step (4) includes the following.

A variable $F_{XY}(k)$ indicating whether the diagnosis variable exceeds a threshold range $[-TH_{XY}(k), TH_{XY}(k)]$ and the polarity thereof is obtained from $F_{XY}(k)=$ $$\begin{cases} 1, & \Delta V_{XY}(k) > TH_{XY}(k) \\ 0, & |\Delta V_{XY}(k)| \le TH_{XY}(k) \\ -1, & \Delta V_{XY}(k) < -TH_{XY}(k) \end{cases}.$$

In some alternative embodiments, Step (5) includes the following.

A corresponding relationship between the fault of the internal switching transistor and the variable $F_{XY}(k)$ is as follows.

When $S_{A2}$ is faulty, $F_{AB}=1$, $F_{BC}=0$, $F_{CA}=-1$;
When $S_{A3}$ is faulty, $F_{AB}=-1$, $F_{BC}=0$, $F_{CA}=1$;
When $S_{B2}$ is faulty, $F_{AB}=-1$, $F_{BC}=1$, $F_{CA}=0$;
When $S_{B3}$ is faulty, $F_{AB}=1$, $F_{BC}=-1$, $F_{CA}=0$;
When $S_{C2}$ is faulty, $F_{AB}=0$, $F_{BC}=-1$, $F_{CA}=1$;
When $S_{C3}$ is faulty, $F_{AB}=0$, $F_{BC}=1$, $F_{CA}=-1$.

In some alternative embodiments, Step (6) includes the following.

During a preset current cycle after completing the fault diagnosis, if at least one value of three diagnosis variables $\Delta V_{AB}(k)$, $\Delta V_{BC}(k)$, and $\Delta V_{CA}(k)$ is greater than a threshold TH(k) at a certain time, the diagnosis result is correct and is represented by $F_{check}=1$. Conversely, during the preset current cycle after completing the fault diagnosis, if values of all sampling points of $\Delta V_{AB}(k)$, $\Delta V_{BC}(k)$, and $\Delta V_{CA}(k)$ all do not exceed the threshold T H (0, the diagnosis result is wrong and is represented by $F_{check}=0$, where the threshold TH(k) is set to $V_{DC}(k)/2+V$.

In some optional implementations, when $F_{check}=0$, a corresponding relationship between the diagnosis result, $F_{check}$, and the checking result is as follows.

$S_{A2}$ fault $\begin{cases} 1, \text{ correct}, S_{A2} \text{ fault} \\ 0, \text{ wrong}, S_{A1} \text{ fault} \end{cases}$;

$S_{A3}$ fault $\begin{cases} 1, \text{ correct}, S_{A3} \text{ fault} \\ 0, \text{ wrong}, S_{A4} \text{ fault} \end{cases}$;

$S_{B2}$ fault $\begin{cases} 1, \text{ correct}, S_{B2} \text{ fault} \\ 0, \text{ wrong}, S_{B1} \text{ fault} \end{cases}$;

$S_{B3}$ fault $\begin{cases} 1, \text{ correct}, S_{B3} \text{ fault} \\ 0, \text{ wrong}, S_{B4} \text{ fault} \end{cases}$;

$S_{C2}$ fault $\begin{cases} 1, \text{ correct}, S_{C2} \text{ fault} \\ 0, \text{ wrong}, S_{C1} \text{ fault} \end{cases}$;

$S_{C3}$ fault $\begin{cases} 1, \text{ correct}, S_{C3} \text{ fault} \\ 0, \text{ wrong}, S_{C4} \text{ fault} \end{cases}$.

According to another aspect of the disclosure, a system for diagnosing an open-circuit fault of a power switching device of a three-phase three-level rectifier is provided, which includes the following.

A diagnosis variable determination module is configured to select an expected value $V_{XY}*(k)$ of a phase-to-phase voltage between an X-phase and a Y-phase of a rectifier k at a current time and an actual value $V_{XY}(k)$ of the phase-to-phase voltage, and use a deviation $\Delta V_{XY}(k)$ between the two is as a diagnosis variable, where XY=AB, BC, CA.

A diagnosis variable calculation module is configured to obtain voltage current information required for diagnosis from a control system of the rectifier, and calculate the diagnosis variable $\Delta V_{XY}(k)$ by adopting a screening technique.

A diagnosis threshold determination module is configured to classify fault sections according to fault characteristics of faulty switches at different times, and update a diagnosis threshold $TH_{XY}(k)$ at the current time for a current fault section.

A polarity determination module is configured to judge whether the diagnosis variable exceeds a threshold range and a polarity thereof according to the diagnosis variable $\Delta V_{XY}(k)$ and the diagnosis threshold $TH_{XY}(k)$.

A diagnosis module is configured to identify and locate a fault of an internal switching transistor according to the above judgment result.

A correction module is configured to check a diagnosis result of the fault to verify whether the diagnosis result is correct, and correct the diagnosis result of a fault of an external switching transistor that may be misdiagnosed as the fault of the internal switching transistor to implement identification and location of an external switching fault.

According to another aspect of the disclosure, a computer-readable storage medium stored with a computer program is provided. When the computer program is executed by a processor, the steps of the method are implemented.

Generally speaking, compared with the prior art, the above technical solutions conceived by the disclosure can achieve the following beneficial effects.

(1) Through Step (6), the disclosure adopts a diagnosis result checking method to implement quick identification and location of the open-circuit faults of all power switching devices in the three-phase three-level rectifier.

(2) Through Step (2), the disclosure adopts a screening calculation method to calculate the deviation of the phase-to-phase voltage, which reduces the calculation error and improves the accuracy of diagnosis.

(3) The disclosure only needs the existing voltage current signals in the control system of the rectifier, so no additional hardware is required and low-cost fault diagnosis can be implemented.

(4) Through Step (3), the disclosure adopts a sectioned real-time update of the threshold, which not only improves the diagnosis speed, but also ensures higher robustness.

DETAILED DESCRIPTION OF DISCLOSED EMBODIMENTS

In order for the objectives, technical solutions, and advantages of the disclosure to be clearer, the following further describes the disclosure in detail with reference to the accompanying drawings and embodiments. It should be understood that the specific embodiments described here are only used to explain the disclosure, but not to limit the disclosure. In addition, the technical features involved in the various embodiments of the disclosure described below may be combined with each other as long as there is no conflict therebetween.

Figure 1:
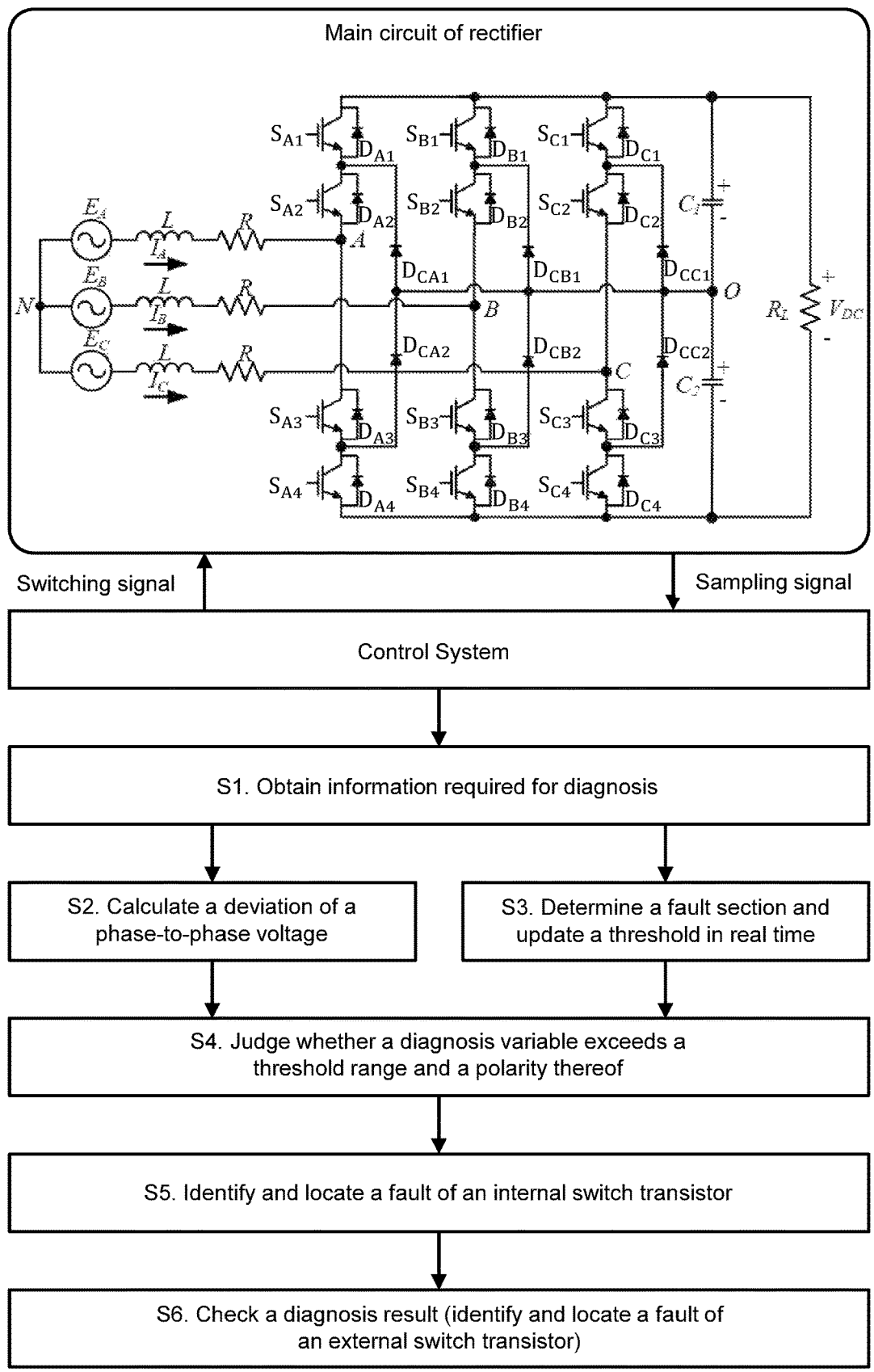
FIG. 1 is a topological structure diagram of a three-phase three-level rectifier and a flowchart of a method for diagnosing an open-circuit fault of a power switching device thereof according to an embodiment of the disclosure.

FIG. 1 shows a method for diagnosing an open-circuit fault of a power switching device of a three-phase three-level rectifier according to an embodiment of the disclosure, which includes the following steps.

In Step S1, information required for diagnosis is obtained from a control system of a rectifier.

Alternating current side three-phase voltages ($E_A(k)$, $E_B(k)$, $E_C(k)$), three-phase currents ($I_A(k)$, $I_B(k)$, $I_C(k)$), and a direct current side voltage ($V_{DC}(k)$) obtained by the three-phase three-level rectifier through sampling are sent to the control system. According to information such as the above signals and the stored alternating current side inductance (L) and equivalent resistance (R), the control system obtains control signals ($S_A(k)$, $S_B(k)$, $S_C(k)$) of each phase power switching device through calculation and sends the same to the rectifier, so that the rectifier runs according to a control target. Therefore, the control system has all the information required for diagnosis. The information is used to calculate a diagnosis variable and update a threshold.

For an X-phase of the rectifier, X=A, B, C, four power switching transistors thereof are classified into two outer switching transistors $S_{X1}$ and $S_{X4}$ and two inner switching transistors $S_{X2}$ and $S_{X3}$. Therefore, the rectifier consists of six outer switching transistors and six inner switching transistors in total.

In Step S2, a deviation of a phase-to-phase voltage is calculated.

Taking an AB phase-to-phase voltage as an example, an expected value $V_{AB}^*(k)$ of the AB phase-to-phase voltage is:

$$V_{AB}^*(k) = \tfrac{1}{2} V_{DC}(k)(S_A(k) - S_B(k)),$$

where k represents a k-th sampling.

An actual value $V_{AB}(k)$ of the AB phase-to-phase voltage is:

$$V_{AB}(k) = (E_A(k) - E_B(k)) - R(I_A(k) - I_B(k)) - \frac{L}{T}[(I_A(k) - I_A(k-1)) - (I_B(k) - I_B(k-1))]$$

where T is a sampling interval time.

For a deviation $\Delta V_{AB}(k)$ of the AB phase-to-phase voltage, when conditions $S_A(k) = S_A(k-1)$, $S_B(k) = S_B(k-1)$, and $S_C(k) = S_C(k-1)$ are satisfied, $\Delta V_{AB}(k) = V_{AB}^*(k) - V_{AB}(k)$; and when one of the conditions $S_A(k) = S_A(k-1)$, $S_B(k) = S_B(k-1)$, and $S_C(k) = S_C(k-1)$ is not satisfied, $\Delta V_{AB}(k) = 0$.

By analogy, a deviation $\Delta V_{BC}(k)$ of a BC phase-to-phase voltage and a deviation $\Delta V_{CA}(k)$ of a CA phase-to-phase voltage are calculated.

In Step S3, fault sections are determined and the threshold is updated in real time.

In Step S3, fault characteristics of different faulty switches at different times are analyzed. If errors are not considered, when the rectifier is working normally, three diagnosis variables $\Delta V_{AB}(k)$, $\Delta V_{BC}(k)$, and $\Delta V_{CA}(k)$ are all zero; and when an open-circuit fault of a switch occurs, the diagnosis variables have different values according to different faulty switches, currents, and switching control signals, as shown in Table 1 below.

TABLE 1

| Current | Faulty switch | $S_X$ | $\Delta V_{XY}$ | $\Delta V_{YZ}$ | $\Delta V_{ZX}$ |
|---|---|---|---|---|---|
| $i_x < 0$ | $S_{x1}$ | 1 | $V_{DC}/2$ | 0 | $-V_{DC}/2$ |
| $i_x > 0$ | $S_{x2}$ | 1 | $V_{DC}$ | 0 | $-V_{DC}$ |
|  |  | 0 | $V_{DC}/2$ | 0 | $-V_{DC}/2$ |
|  | $S_{x3}$ | 0 | $-V_{DC}/2$ | 0 | $V_{DC}/2$ |
|  |  | -1 | $-V_{DC}$ | 0 | $V_{DC}$ |
|  | $S_{x4}$ | -1 | $-V_{DC}/2$ | 0 | $V_{DC}/2$ |
| $i_x = 0$ | $S_{x2}$ | 1 | $[0, V_{DC}]$ | 0 | $[-V_{DC}, 0]$ |
|  |  | 0 | $[0, V_{DC}/2]$ | 0 | $[-V_{DC}/2, 0]$ |
|  | $S_{x3}$ | 0 | $[-V_{DC}/2, 0]$ | 0 | $[0, V_{DC}/2]$ |
|  |  | -1 | $[-V_{DC}, 0]$ | 0 | $[0, V_{DC}]$ |

For the fault diagnosis of the internal switching transistor, the specific method for determining the threshold is as follows.

Taking the AB phase as an example, a current zero zone and a current non-zero zone are determined.

$$I_{AB}(k) = \begin{cases} 0, & |I_A(k)| \le I_{TH} \text{ or } |I_B(k)| \le I_{TH} \\ 1, & |I_A(k)| > I_{TH} \text{ and } |I_B(k)| > I_{TH} \end{cases}$$

where $I_{AB}(k)=0$ represents $I_A$ or $I_B$ is in the current zero zone, $I_{AB}(k)=1$ represents that $I_A$ or $I_B$ are both in the current non-zero zone, $I_{TH}$ is a current threshold, and a current amplitude may be 5%.

By analogy, current zero zones and current non-zero zones of the BC phase and the CA phase are determined.

Taking the AB phase as an example, a main threshold is updated.

$$TH_{AB}(k) = \begin{cases} \dfrac{V_{DC}(k)}{4} - V, & I_{AB}(k) = 0 \\ \dfrac{V_{DC}(k)}{2} - V, & I_{AB}(k) = 1 \end{cases}$$

where V is a relatively small constant, which may be 2% times of $V_{DC}$.

By analogy, main thresholds of the BC phase and the CA phase are updated.

The threshold required for diagnosis result checking is updated.

$$TH(k) = \dfrac{V_{DC}(k)}{2} + V$$

In Step S4, whether the diagnosis variable exceeds a main threshold range and a polarity thereof is judged.

Taking the AB phase as an example, a variable $F_{AB}(k)$ indicating whether $\Delta V_{AB}(k)$ exceeds a range $[-TH_{AB}(k), TH_{AB}(k)]$ and the polarity thereof is:

$$F_{AB}(k) = \begin{cases} 1, & \Delta V_{AB}(k) > TH_{AB}(k) \\ 0, & |\Delta V_{AB}(k)| \le TH_{AB}(k) \\ -1, & \Delta V_{AB}(k) < -TH_{AB}(k) \end{cases}$$

By analogy, indicating variables $F_{BC}(k)$ and $F_{CA}(k)$ of the BC phase and the CA phase are determined.

In Step S5, the fault of the internal switching transistor is identified and located.

After obtaining $F_{AB}(k)$, $F_{BC}(k)$, and $F_{CA}(k)$, the fault of the internal switching transistor may be located according to Table 2.

TABLE 2

Fault diagnosis of internal switching transistor

| Faulty switch | $F_{AB}$ | $F_{BC}$ | $F_{CA}$ |
|---|---|---|---|
| $S_{A2}$ | 1 | 0 | −1 |
| $S_{A3}$ | −1 | 0 | 1 |
| $S_{B2}$ | −1 | 1 | 0 |
| $S_{B3}$ | 1 | −1 | 0 |
| $S_{C2}$ | 0 | −1 | 1 |
| $S_{C3}$ | 0 | 1 | −1 |

In Step S6, the diagnosis result is checked (a fault of an external switching transistor is identified and located).

After obtaining the diagnosis result of Step S5, whether $\Delta V_{AB}(k)$, $\Delta V_{BC}(k)$, and $\Delta V_{CA}(k)$ are greater than the threshold TH(k) is judged. During ⅛ of a current cycle, if a value of at least one sampling point of any of the variables $\Delta V_{AB}(k)$, $\Delta V_{BC}(k)$, and $\Delta V_{CA}(k)$ is greater than the threshold TH(k), the diagnosis result is correct and is represented by $F_{check}=1$. Conversely, during ⅛ of the current cycle, if values of all sampling points of $\Delta V_{AB}(k)$, $\Delta V_{BC}(k)$, and $\Delta V_{CA}(k)$ do not exceed the threshold TH(k), the diagnosis result is wrong and is represented by $F_{check}=0$. When $F_{check}=0$, the diagnosis result is corrected to a fault of a corresponding external switching transistor, as shown in Table 3. Taking the diagnosis result of Step S5 being $S_{A2}$ open-circuit fault as an example, if $F_{check}=1$, it represents that the diagnosis result is correct and it is $S_{A2}$ open-circuit fault; and if $F_{check}=0$, it represents that the diagnosis result is wrong and is corrected to $S_{A1}$ open-circuit fault.

TABLE 3

Correction of diagnosis result (fault diagnosis of external switching transistor)

| Diagnosis result | $F_{check}$ | Checking result |
|---|---|---|
| $S_{A2}$ fault | 1 | Correct, $S_{A2}$ fault |
| | 0 | Wrong, $S_{A1}$ fault |
| $S_{A3}$ fault | 1 | Correct, $S_{A3}$ fault |
| | 0 | Wrong, $S_{A4}$ fault |
| $S_{B2}$ fault | 1 | Correct, $S_{B2}$ fault |
| | 0 | Wrong, $S_{B1}$ fault |
| $S_{B3}$ fault | 1 | Correct, $S_{B3}$ fault |
| | 0 | Wrong, $S_{B4}$ fault |
| $S_{C2}$ fault | 1 | Correct, $S_{C2}$ fault |
| | 0 | Wrong, $S_{C1}$ fault |
| $S_{C3}$ fault | 1 | Correct, $S_{C3}$ fault |
| | 0 | Wrong, $S_{C4}$ fault |

Figure 2:
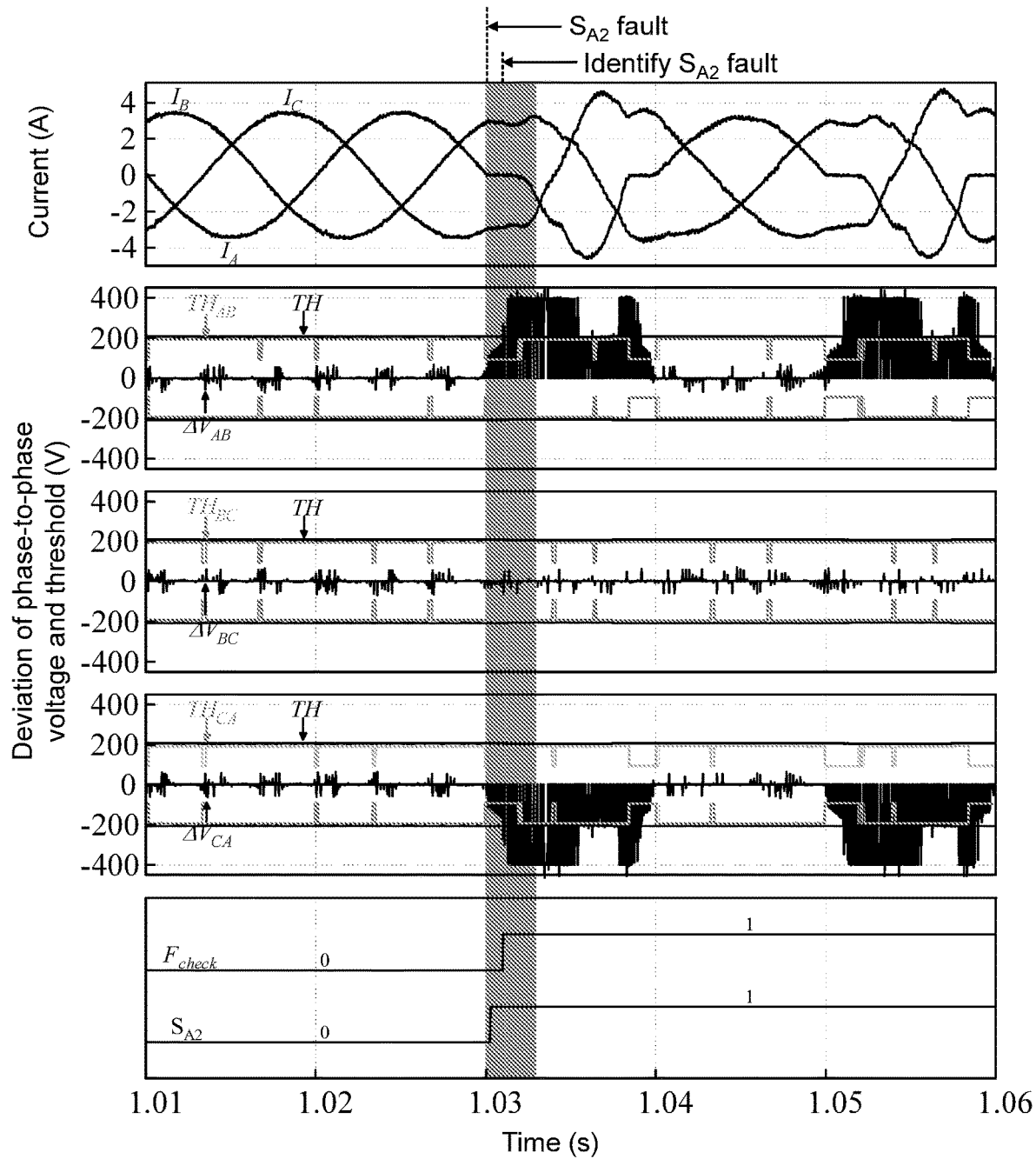
FIG. 2 is a diagram of a diagnosis result of an open-circuit fault of an internal switching transistor of a three-phase three-level rectifier according to an embodiment of the disclosure.
Figure 3:
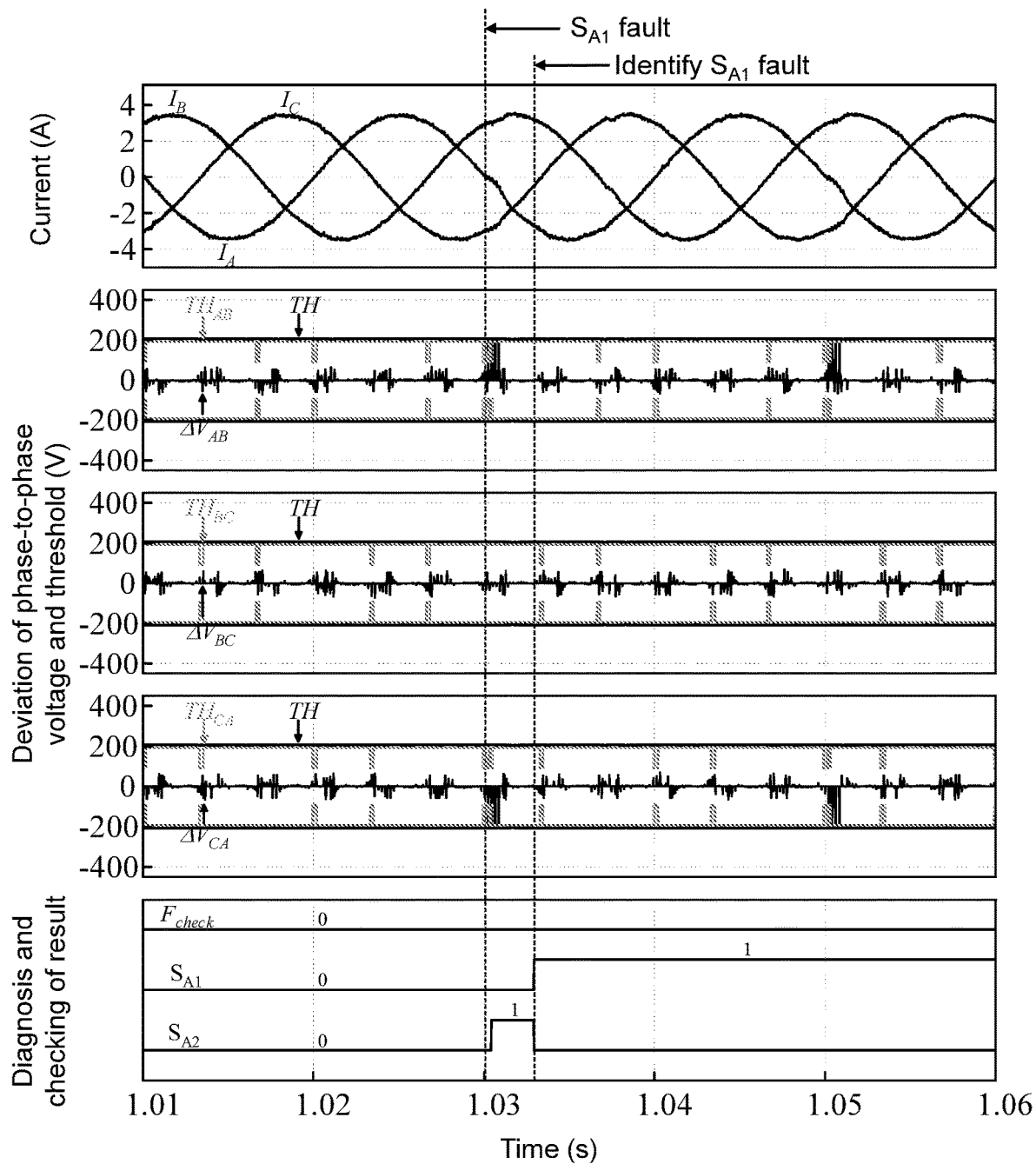
FIG. 3 is a diagram of a diagnosis result of an open-circuit fault of an external switching transistor of a three-phase three-level rectifier according to an embodiment of the disclosure.

In order to describe the example more clearly, FIG. 2 and FIG. 3 provide the diagnosis result of the example, and the parameters used are shown in Table 4.

TABLE 4

| Parameters used in example | |
|---|---|
| Alternating current side voltages $E_A$, $E_B$, $E_C$ | 110 V(rms), 50 Hz |
| Sampling interval T | 25 μs |
| Switching frequency f | 5 kHz |
| Alternating current side inductance L | 5 mH |
| Direct current side given voltage V | 400 V |
| Direct current side resistance $R_L$ | 200 Ω |

As shown in FIG. 2, the open-circuit fault of the switch $S_{A2}$ occurs at 1.03 s. After the fault, $\Delta V_{AB}(k)$ rapidly increases to $\Delta V_{AB}(k) > TH_{AB}(k)$, so that $F_{AB}(k)=1$; $\Delta V_{CA}(k)$ rapidly decreases to $\Delta V_{CA}(k) < -TH_{CA}(k)$, so that $F_{CA}(k)=-1$; and $\Delta V_{BC}(k)$ is always within the threshold range, $F_{BC}(k)=0$. Therefore, according to Table 2, the switch $S_{A2}$ is diagnosed as the open-circuit fault, and the diagnosis time is about 0.3 ms. Also, during ⅛ of the current cycle after identifying $S_{A2}$ open-circuit fault, that is $F_{check}=1$, the diagnosis may be verified as correct according to Table 3.

As shown in FIG. 3, the open-circuit fault of the switch $S_{A1}$ occurs at 1.03 s. After the fault, $\Delta V_{AB}(k)$ rapidly increases to $\Delta V_{AB}(k) > TH_{AB}(k)$, so that $F_{AB}(k)=1$; $\Delta V_{CA}(k)$ rapidly decreases to $\Delta V_{CA}(k) < -TH_{CA}(k)$, so that $F_{CA}(k)=-1$; and $\Delta V_{BC}(k)$ is always within the threshold range, $F_{BC}(k)=0$. Therefore, according to Table 2, the switch $S_{A2}$ is diagnosed as the open-circuit fault. However, during ⅛ of the current cycle after identifying $S_{A2}$ open-circuit fault, $\Delta V_{AB}(k)$, $\Delta V_{BC}(k)$, and $\Delta V_{CA}(k)$ are all within the threshold range $[-TH(k), TH(k)]$, so $F_{check}=0$. According to Table 3, the diagnosis result is corrected to $S_{A1}$ open-circuit fault, and the diagnosis time is about 3 ms.

The above results prove that the disclosure can implement the open-circuit fault diagnosis of all power switching devices of the three-phase three-level rectifier and ensure the speed and the accuracy of the fault diagnosis of the internal switching transistor that has a greater impact on the system, and the overall diagnosis speed is faster.

The disclosure also provides a system for diagnosing an open-circuit fault of a power switching device of a three-phase three-level rectifier, which includes the following.

A diagnosis variable determination module is configured to select an expected value $V_{XY}^*(k)$ of a phase-to-phase voltage between an X-phase and a Y-phase of a rectifier k at the current time and an actual value $V_{XY}(k)$ of the phase-to-phase voltage, and use a deviation $\Delta V_{XY}(k)$ between the two is as a diagnosis variable, where XY=AB, BC, CA.

A diagnosis variable calculation module is configured to obtain voltage current information required for diagnosis from a control system of the rectifier, and calculate the diagnosis variable $\Delta V_{XY}(k)$ by adopting a screening technique.

A diagnosis threshold determination module is configured to classify fault sections according to fault characteristics of faulty switches at different times, and update a diagnosis threshold $TH_{XY}(k)$ at the current time for a current fault section.

A polarity determination module is configured to judge whether the diagnosis variable exceeds a threshold range and a polarity thereof according to the diagnosis variable $\Delta V_{XY}(k)$ and the diagnosis threshold $TH_{XY}(k)$.

A diagnosis module is configured to identify and locate a fault of an internal switching transistor according to the above judgment result.

A correction module is configured to check a diagnosis result of the fault to verify whether the diagnosis result is correct, and correct the diagnosis result of a fault of an external switching transistor that may be misdiagnosed as the fault of the internal switching transistor to implement identification and location of an external switching fault.

For the specific implementation of each module, reference may be made to the description of the foregoing embodiment of the method, which will not be repeated in the embodiment of the disclosure.

The disclosure also provides a computer-readable storage medium stored with a computer program. When the program is executed by a processor, the method for diagnosing the open-circuit fault of the power switching device of the three-phase three-level rectifier in the embodiment of the method is implemented.

It should be noted that according to implementation requirements, each step/component described in the disclosure may be split into more steps/components or two or more steps/components or partial operation of a step/component may be combined into a new step/component to implement the objective of the disclosure.

Persons skilled in the art may easily understand that the above are only preferred embodiments of the disclosure and are not intended to limit the disclosure. Any modification, equivalent replacement, improvement, etc., made within the spirit and principle of the disclosure should be included in the protection scope of the disclosure.

What is claimed is:

1. A method for diagnosing an open-circuit fault of a power switching device of a three-phase three-level rectifier, executed by a processor when executing a computer program, the method comprising:

Step (1) of selecting an expected value of a phase-to-phase voltage between an X-phase and a Y-phase of the rectifier at a current time and an actual value of the phase-to-phase voltage, and using a deviation between the two as a diagnosis variable;

Step (2) of obtaining voltage current information required for diagnosis from a control system of the rectifier, and calculating the diagnosis variable by adopting a screening technique;

Step (3) of classifying fault sections according to fault characteristics of faulty switches at different times, and updating a diagnosis threshold at the current time for a current fault section;

Step (4) of judging whether the diagnosis variable exceeds a threshold range and a polarity thereof according to the diagnosis variable and the diagnosis threshold;

Step (5) of identifying and locating a fault of an internal switching transistor according to the judgment result; and Step (6) of checking a diagnosis result of the fault to verify whether the diagnosis result is correct, and correcting the diagnosis result of a fault of an external switching transistor that is misdiagnosed as the fault of the internal switching transistor to implement identification and location of an external switching fault, wherein the fault of the internal switching transistor is determined based on the diagnosis result is correct, and the fault of the external switching transistor is determined based on the diagnosis result is wrong, wherein alternating current side three-phase voltages, three-phase currents and a direct current side voltage obtained by the three-phase three-level rectifier through sampling are sent to the control system, and, according to the alternating current side three-phase voltages, the three-phase currents, the direct current side voltage, an alternating current side inductance and an alternating current side equivalent resistance, the control system obtains three-phase switching control signals of each power switching device of the three-phase three-level rectifier through calculation and sends the three-phase switching control signals to the three-phase three-level rectifier.

2. The method according to claim 1, comprising:

obtaining the expected value $V_{XY}^*(k)$ of the phase-to-phase voltage from $V_{XY}^*(k) = \frac{1}{2} V_{DC}(k)(S_X(k) - S_Y(k))$, and obtaining the actual value $V_{XY}(k)$ of the phase-to-phase voltage from $$V_{XY}(k) = (E_X(k) - E_Y(k)) - R(I_X(k) - I_Y(k)) - \frac{L}{T}[(I_X(k) - I_X(k-1)) - (I_Y(k) - I_Y(k-1))],$$

where $V_{DC}(k)$ is the direct current side voltage of the rectifier at the current time; $S_X(k)$ and $S_Y(k)$ are respectively switching control signals of the X-phase and the Y-phase of the rectifier, $S_X(k)=1$ represents that switches $S_{X1}$ and $S_{X2}$ are turned on and switches $S_{X3}$ and $S_{X4}$ are turned off, $S_X(k)=0$ represents that the switches $S_{X2}$ and $S_{X3}$ are turned on and the switches $S_{X1}$ and $S_{X4}$ are turned off, and $S_X(k)=-1$ represents that the switches $S_{X3}$ and $S_{X4}$ are turned on and the switches $S_{X1}$ and $S_{X2}$ are turned off; $E_X(k)$ and $E_Y(k)$ are respectively alternating current side voltages of the X-phase and the Y-phase of the rectifier; $I_X(k)$ and $I_Y(k)$ are respectively alternating current side currents of the X-phase and the Y-phase of the rectifier; R is the alternating current side equivalent resistance of the rectifier; L is the alternating current side inductance of the rectifier; T is a sampling interval time, k represents a sampling point at the current time, k−1 represents a sampling point at a previous time, and X and Y=A and B, B and C, or C and A.

3. The method according to claim 2, wherein Step (2) comprises:

$\Delta V_{XY}(k)=V_{XY}^*(k)-V_{XY}(k)$ when there is no switching of the three-phase switching control signals between the sampling points k and k−1, that is, when $S_A(k)=S_A(k-1)$, $S_B(k)=S_B(k-1)$, and $S_C(k)=S_C(k-1)$ are satisfied; and not calculating $\Delta V_{XY}(k)$, and regarding $\Delta V_{XY}(k)$ at the current time as zero when one of $S_A(k)=S_A(k-1)$, $S_B(k)=S_B(k-1)$, and $S_C(k)=S_C(k-1)$ is not satisfied, where $\Delta V_{XY}(k)$ represents the deviation between the expected value of the phase-to-phase voltage between the X-phase and the Y-phase and the actual value of the phase-to-phase voltage.

4. The method according to claim 1, wherein Step (3) comprises:

dividing the fault sections into a current zero zone and a current non-zero zone, and setting different diagnosis thresholds $TH_{XY}(k)$ for different sections:

$$TH_{XY}(k) = \begin{cases} \dfrac{V_{DC}(k)}{4} - V, & I_{XY}(k)=0 \\ \dfrac{V_{DC}(k)}{2} - V, & I_{XY}(k)=1 \end{cases}$$

for a fault diagnosis of the internal switching transistor, where V is a preset value, which is a constant; $I_{XY}(k)=0$ represents that $I_X$ or $I_Y$ is in the current zero zone, $I_{XY}(k)=1$ represents that $I_X$ and $I_Y$ are both in the current non-zero zone, and $V_{DC}(k)$ is the direct current side voltage of the rectifier at the current time; and providing a following definition:

$$I_{XY}(k) = \begin{cases} 0, & |I_X(k)| \le I_{TH} \text{ or } |I_Y(k)| \le I_{TH} \\ 1, & |I_X(k)| > I_{TH} \text{ and } |I_Y(k)| > I_{TH} \end{cases}$$

for the definition of the current zero zone and the current non-zero zone, considering noise and fluctuations of current, where $I_{TH}$ is a current threshold.

5. The method according to claim 4, wherein Step (4) comprises:

obtaining a variable $F_{XY}(k)$ indicating whether the diagnosis variable exceeds a threshold range $[-TH_{XY}(k), TH_{XY}(k)]$ and the polarity thereof from $$F_{XY}(k) = \begin{cases} 1, & \Delta V_{XY}(k) > TH_{XY}(k) \\ 0, & |\Delta V_{XY}(k)| \le TH_{XY}(k) \\ -1, & \Delta V_{XY}(k) < -TH_{XY}(k) \end{cases}$$

6. The method according to claim 5, wherein Step (5) comprises:

a corresponding relationship between the fault of the internal switching transistor and the variable $F_{XY}(k)$ being:

when $S_{A2}$ is faulty, $F_{AB}=1$, $F_{BC}=0$, $F_{CA}=1$;
when $S_{A3}$ is faulty, $F_{AB}=1$, $F_{BC}=0$, $F_{CA}=1$;
when $S_{B2}$ is faulty, $F_{AB}=1$, $F_{BC}=1$, $F_{CA}=0$;
when $S_{B3}$ is faulty, $F_{AB}=1$, $F_{BC}=1$, $F_{CA}=0$;
when $S_{C2}$ is faulty, $F_{AB}=0$, $F_{BC}=-1$, $F_{CA}=1$; and
when $S_{C3}$ is faulty, $F_{AB}=0$, $F_{BC}=1$, $F_{CA}=-1$.

7. The method according to claim 6, wherein Step (6) comprises:

the diagnosis result being correct and being represented by $F_{check}=1$ when at least one value of three diagnosis variables $\Delta V_{AB}(k)$, $\Delta V_{BC}(k)$, and $\Delta V_{CA}(k)$ is greater than a threshold TH(k) at a certain time during a preset current cycle after completing the fault diagnosis; and conversely, the diagnosis result being wrong and being represented by $F_{check}=0$ when values of all sampling points of $\Delta V_{AB}(k)$, $\Delta V_{BC}(k)$, and $\Delta V_{CA}(k)$ all do not exceed the threshold TH(k) during the preset current cycle after completing the fault diagnosis, where the threshold TH(k) is set to $V_{DC}(k)/2+V$.

8. The method according to claim 7, wherein when $F_{check}=0$, a corresponding relationship between the diagnosis result, $F_{check}$, and a checking result is:

$S_{A2}$ fault $\begin{cases} 1, \text{correct}, S_{A2} \text{ fault} \\ 0, \text{wrong}, S_{A1} \text{ fault} \end{cases}$;

$S_{A3}$ fault $\begin{cases} 1, \text{correct}, S_{A3} \text{ fault} \\ 0, \text{wrong}, S_{A4} \text{ fault} \end{cases}$;

$S_{B2}$ fault $\begin{cases} 1, \text{correct}, S_{B2} \text{ fault} \\ 0, \text{wrong}, S_{B1} \text{ fault} \end{cases}$;

$S_{B3}$ fault $\begin{cases} 1, \text{correct}, S_{B3} \text{ fault} \\ 0, \text{wrong}, S_{B4} \text{ fault} \end{cases}$;

$S_{C2}$ fault $\begin{cases} 1, \text{correct}, S_{C2} \text{ fault} \\ 0, \text{wrong}, S_{C1} \text{ fault} \end{cases}$; and $S_{C3}$ fault $\begin{cases} 1, \text{correct}, S_{C3} \text{ fault} \\ 0, \text{wrong}, S_{C4} \text{ fault} \end{cases}$.

9. A non-transitory computer-readable storage medium stored with a computer program, wherein when the computer program is executed by a processor, steps of the method according to claim 1 are implemented.

10. A non-transitory computer-readable storage medium stored with a computer program, wherein when the computer program is executed by a processor, steps of the method according to claim 2 are implemented.

11. A non-transitory computer-readable storage medium stored with a computer program, wherein when the computer program is executed by a processor, steps of the method according to claim 3 are implemented.

12. A non-transitory computer-readable storage medium stored with a computer program, wherein when the computer program is executed by a processor, steps of the method according to claim 4 are implemented.

13. A non-transitory computer-readable storage medium stored with a computer program, wherein when the computer program is executed by a processor, steps of the method according to claim 5 are implemented.

14. A non-transitory computer-readable storage medium stored with a computer program, wherein when the computer program is executed by a processor, steps of the method according to claim 6 are implemented.

15. A non-transitory computer-readable storage medium stored with a computer program, wherein when the computer program is executed by a processor, steps of the method according to claim 7 are implemented.

16. A non-transitory computer-readable storage medium stored with a computer program, wherein when the computer program is executed by a processor, steps of the method according to claim 8 are implemented.

17. A system for diagnosing an open-circuit fault of a power switching device of a three-phase three-level rectifier, comprising:
- a diagnosis variable determination module, configured to select an expected value of a phase-to-phase voltage between an X-phase and a Y-phase of the rectifier at a current time and an actual value of the phase-to-phase voltage, and use a deviation between the two is as a diagnosis variable;
- a diagnosis variable calculation module, configured to obtain voltage current information required for diagnosis from a control system of the rectifier, and calculate the diagnosis variable by adopting a screening technique;
- a diagnosis threshold determination module, configured to classify fault sections according to fault characteristics of faulty switches at different times, and update a diagnosis threshold at the current time for a current fault section;
- a polarity determination module, configured to judge whether the diagnosis variable exceeds a threshold range and a polarity thereof according to the diagnosis variable and the diagnosis threshold;
- a diagnosis module, configured to identify and locate a fault of an internal switching transistor according to the judgment result;
- a correction module, configured to check a diagnosis result of the fault to verify whether the diagnosis result is correct, and correct the diagnosis result of a fault of an external switching transistor that is misdiagnosed as the fault of the internal switching transistor to implement identification and location of an external switching fault, wherein the fault of the internal switching transistor is determined based on the diagnosis result is correct, and the fault of the external switching transistor is determined based on the diagnosis result is wrong, wherein alternating current side three-phase voltages, three-phase currents and a direct current side voltage obtained by the three-phase three-level rectifier through sampling are sent to the control system, and, according to the alternating current side three-phase voltages, the three-phase currents, the direct current side voltage, an alternating current side inductance and an alternating current side equivalent resistance, the control system obtains three-phase switching control signals of each power switching device of the three-phase three-level rectifier through calculation and sends the three-phase switching control signals to the three-phase three-level rectifier.

* * * * *